(12) United States Patent
Kraus et al.

(10) Patent No.: US 6,660,659 B1
(45) Date of Patent: Dec. 9, 2003

(54) PLASMA METHOD AND APPARATUS FOR PROCESSING A SUBSTRATE

(75) Inventors: Philip Allan Kraus, San Jose, CA (US); Thai Cheng Chua, San Jose, CA (US); John Holland, San Jose, CA (US); James P. Cruse, Capitola, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/170,925

(22) Filed: Jun. 12, 2002

(51) Int. Cl.[7] .................. H01L 21/31; H01L 21/469; H01L 21/26
(52) U.S. Cl. .................. 438/776; 438/783; 438/798
(58) Field of Search ................ 438/776, 775, 438/783, 798

(56) References Cited

U.S. PATENT DOCUMENTS 6,136,654 A * 10/2000 Kraft et al. ............... 438/287
6,503,846 B1 * 1/2003 Niimi et al. .............. 438/776
6,528,434 B2 * 3/2003 Chen ....................... 438/787
6,548,366 B2 * 4/2003 Niimi et al. .............. 438/384
2002/0127882 A1 * 9/2002 Chen ....................... 438/787
2002/0197884 A1 * 12/2002 Niimi et al. .............. 438/775
2002/0197886 A1 * 12/2002 Niimi et al. .............. 438/783

* cited by examiner

Primary Examiner—Alexander Ghyka
(74) Attorney, Agent, or Firm—Blakely Sokoloff Taylor & Zafman (57) ABSTRACT

According to one aspect of the invention, a method is provided of processing a substrate, including locating the substrate in a processing chamber, creating a nitrogen plasma in the chamber, the plasma having an ion density of at least $10^{10}$ cm$^{-3}$, and a potential of less than 20 V, and exposing a layer on the substrate to the plasma to incorporate nitrogen of the plasma into the layer.

20 Claims, 13 Drawing Sheets

PLASMA METHOD AND APPARATUS FOR PROCESSING A SUBSTRATE

BACKGROUND OF THE INVENTION

1). Field of the Invention

This invention relates to a plasma reactor and a method of processing a substrate by creating a plasma.

2). Discussion of Related Art

The manufacture of integrated circuits involves the manufacture of field effect transistors in and on silicon or other semiconductor substrates. The manufacture of a field effect transistor includes the formation of a gate dielectric layer. The dielectric layer is typically grown by exposing silicon of the substrate to oxygen, thereby forming silicon dioxide gate dielectric layers.

As logic devices have become smaller, it has become advantageous to include nitrogen into the silicon dioxide gate dielectric layers. Nitrogen is often incorporated by creating a plasma of nitrogen ions within a chamber and implanting the nitrogen ions into the gate dielectric layer. The plasma is typically created utilizing a radio frequency (RF) source, with either an electrode plate (capacitative coupling) or a coil (inductive coupling). The RF source creates an RF field within a gas in the chamber, and this coupling creates the plasma.

Independent of the type of RF source (plate or coil), there can be significant capacitative coupling from the source to the plasma, which creates a relatively large plasma potential, on the order of tens of volts. Such a large plasma potential may cause excessive bombardment of the silicon dioxide layer with nitrogen ions, which can cause damage to the silicon dioxide layer and even incorporation of nitrogen into the underlying silicon. Damage to the silicon dioxide layer or incorporation of nitrogen into the underlying silicon diminishes the advantages of nitrogen incorporation.

SUMMARY OF THE INVENTION

According to one aspect of the invention, a method is provided of processing a substrate, including locating the substrate in a processing chamber, creating a nitrogen plasma in the chamber, the plasma having an ion density of at least $10^{10}$ cm$^{-3}$, and a potential of less than 20 V, and exposing a layer on the substrate to the plasma to incorporate nitrogen from the plasma into the layer.

According to another aspect of the invention, a method of processing a substrate is provided, wherein the substrate is located in a plasma processing chamber, a nitrogen-containing gas flows into the chamber, an RF current is provided through a coil to generate an RF field in the chamber, the RF field creating a nitrogen-containing RF plasma out of the gas, the RF current being pulsed, and incorporating nitrogen ions and excited neutrals from the plasma into a gate dielectric layer formed on the substrate.

According to a further aspect of the invention, a plasma reactor is provided, including a chamber having an opening to transfer a substrate into an internal volume of the chamber, a substrate holder in the chamber for holding the substrate, an RF coil externally and adjacent to a wall of the chamber, and a grounded electrode plate between the wall and the RF coil.

BRIEF DESCRIPTION OF THE DRAWINGS

The invention is further described by way of examples with reference to the accompanying drawings, wherein.

DETAILED DESCRIPTION OF THE INVENTION

Figure 1:
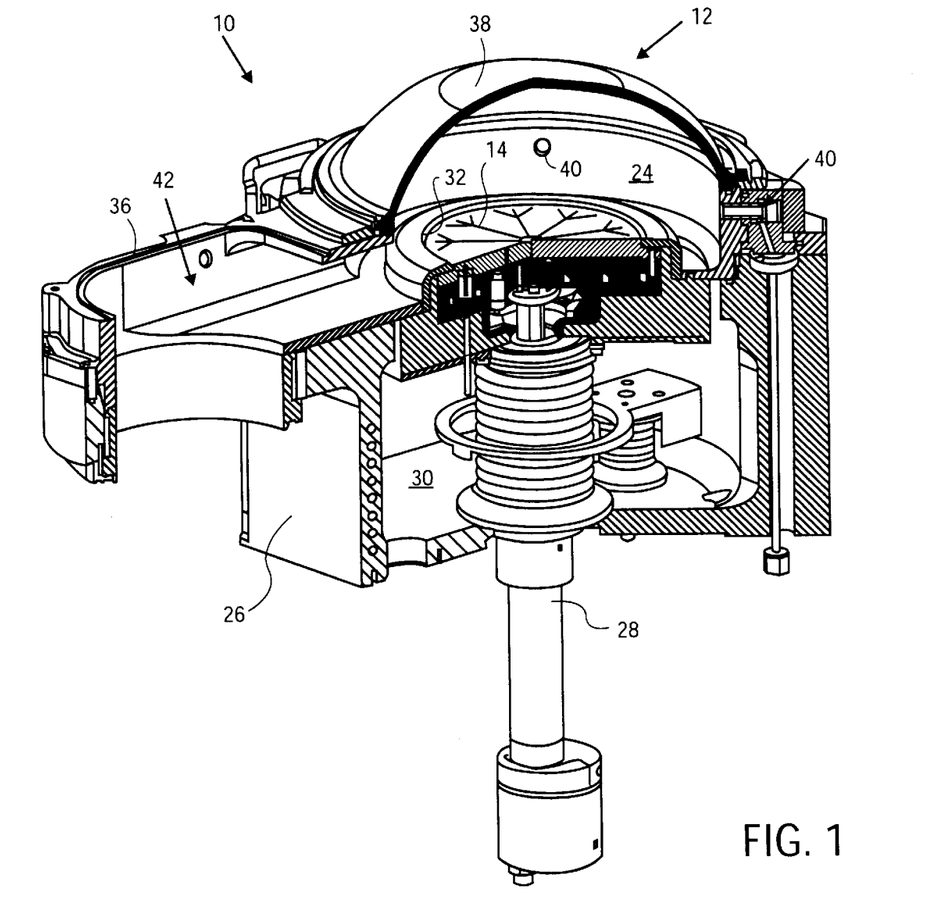
FIG. 1 is a perspective view of a plasma reactor according to an embodiment of the invention.
Figures 2, 3:
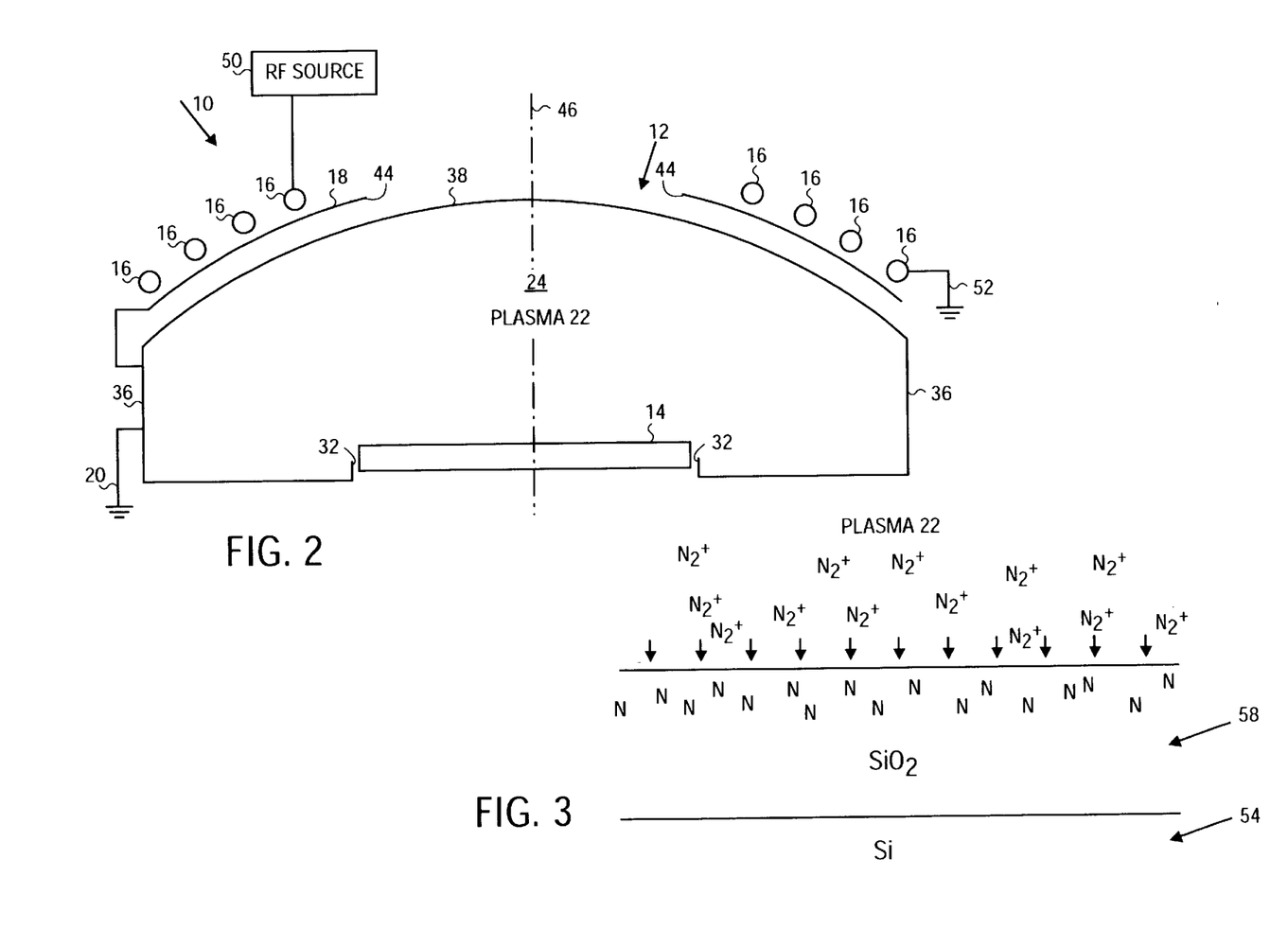
FIG. 2 is a cross-sectional side view of upper components of the plasma reactor.
FIG. 3 is a cross-sectional side view illustrating nitrogen ion incorporation into a silicon dioxide gate dielectric layer.

FIGS. 1 and 2 illustrate a plasma reactor 10, according to an embodiment of the invention, including a chamber 12, a substrate holder 14, an RF coil 16, and an electrode plate 18. The electrode plate 18 is connected through a body of the chamber 12 to ground 20. By grounding the electrode plate 18, a capacitive coupling between the RF coil 16 and a plasma 22 in an internal volume 24 of the chamber 12 is eliminated. The elimination of the capacitive couple reduces the potential of the plasma 22 without dramatically altering other properties of the plasma 22, such as ion density and electron density. The inductive coupling from the RF coil 16 is not eliminated, and this coupling creates and maintains the plasma 22.

Referring specifically to FIG. 1, the plasma reactor 10 further includes a lower transfer chamber 26 and a transfer mechanism 28. The chamber 12 is positioned on top of the transfer chamber 26. An internal volume 30 of the transfer chamber 26 is placed in communication with the internal volume 24 of the chamber 12 through a circular opening 32 in a base of the chamber 12. The substrate holder 14 is secured on top of the transfer mechanism 28, and the transfer mechanism 28 can be used to elevate or lower the substrate holder 14.

In use, the transfer mechanism 28 is operated so that the substrate holder 14 is lowered into the internal volume 30 of the transfer chamber 26. A wafer substrate, positioned on a blade attached to a robot arm, is then transferred through a slit-valve opening in a wall of the transfer chamber 26 into the internal volume 30. The transfer mechanism 28 is then operated to elevate the substrate holder 14 so that the substrate holder 14 contacts a lower surface of the wafer substrate and elevates the wafer substrate off the blade. The blade is then removed from the transfer chamber 26, whereafter the transfer mechanism 28 is again operated to elevate the substrate holder 14 into the opening 32. The wafer substrate, located on the substrate holder 14, then has an upper surface which is exposed to the internal volume 24 of the chamber 12.

The chamber 12 includes primarily a conductive body 36 and a dielectric quartz upper wall 38. The conductive body 36 forms a lower portion of the chamber 12, and the upper wall 38 forms an upper portion of the chamber 12. The conductive body 36 and the upper wall 38 jointly define the internal volume 24.

Four gas nozzle ports 40 are formed through the conductive body 36 into the internal volume 24. The gas nozzle ports 40 are positioned at 90° intervals around the substrate holder 14. The conductive body 36 also defines a vacuum pumping channel 42 on one side thereof. The gas nozzle ports 40 are connected through valves to a gas manifold, and the vacuum pumping channel 42 is connected to a pump. When the pump is operated, gases are extracted from the internal volume 24 through the vacuum pumping channel 42 to reduce a pressure within the internal volume 24. The valves can be operated to allow gases from the manifold through the valves and the gas nozzle ports 40 into the internal volume 24.

Referring more specifically to FIG. 2, the upper wall 38 has a dome shape, and the electrode plate 18 has a dome shape that conforms to an outer surface of the upper wall 38. The electrode plate 18 is in fact located directly on the upper wall 38. The electrode plate 18 defines a circular opening 44 over a center of the upper wall 38. The upper wall 38 and the electrode plate 18 are symmetrical around a vertical axis 46.

The coil 16 spirals around the vertical axis 46 and the opening 44. The coil 16 is positioned on and conforms to the dome shape of the electrode plate 18. One end of the coil 16 is connected to an RF source 50, and an opposing end of the coil 16 is connected to ground 52.

Reference is now made to FIGS. 2 and 3 in combination. An epitaxial silicon layer 54 is formed on an upper surface of a wafer substrate before the wafer substrate is inserted into the plasma reactor 10 positioned on an upper surface of the substrate holder 14. A thin silicon dioxide layer 58 is grown on the silicon layer 54, also before the wafer substrate is inserted into the plasma reactor 10. The silicon dioxide layer 58 is on the order of a few angstroms (e.g., 40 Å) thick, and is later used as a gate dielectric layer in a finally manufactured transistor. The purpose of inserting the wafer substrate into the plasma reactor 10 is to incorporate nitrogen (N) into the silicon dioxide layer 58 for purposes of modifying or improving its dielectric properties. The plasma 22 of nitrogen ions ($N_2+$) is created within the internal volume 24. The nitrogen ions have energies defined by the properties of the plasma which leads to their being incorporated into the silicon dioxide layer 58.

The plasma is created by first reducing the pressure within the internal volume 24 to a predetermined level. A nitrogen-containing gas is then introduced into the internal volume 24. The nitrogen-containing gas may, for example, be pure nitrogen ($N_2$), a mixture of nitrogen and helium gases ($N_2$/He), a mixture of nitrogen and neon gases ($N_2$/Ne), or a mixture of nitrogen and argon gases ($N_2$/Ar). For purposes of further discussion, examples are given where the gas is pure nitrogen gas.

The RF source 50 is then operated to provide RF current to the coil 16 at a frequency of 13.56 MHz. The RF coil 16 generates an RF field which is spread by the electrode plate 18 across the upper wall 38. The circular opening 44 permits the RF field to enter through the upper wall 38 into the internal volume 24. The RF field then couples with the nitrogen gas in the internal volume 24. The RF field initially excites a small number of free electrons. The free electrons then collide with other atoms to release more electrons from these atoms. The process is continued until a steady-state condition is achieved, where the plasma 22 has a steady amount of free electrons and free ions, a steady electron temperature, and a constant voltage relative to ground. A "reservoir" of ions is so created within the internal volume 24, and the voltage potential of the plasma 22 assists in incorporating ions from this reservoir into the silicon dioxide layer 58. The potential of the substrate and the substrate holder 14 floats freely during the entire process, but there is a difference in the voltage of the plasma 22 and that of the substrate holder 14, the difference driving the incorporation of the ions.

Without grounding the electrode plate 18, the RF coil 16 couples capacitively to the plasma 22. Such a capacitive couple between the RF coil 16 and the plasma 22 increases the voltage of the plasma 22. Conversely, by grounding the electrode plate 18, the capacitive coupling is substantially reduced, and the voltage of the plasma 22 is reduced. The plasma potential and the electron temperature are reduced, but ion density remains relatively high. To prevent excessive incorporation of nitrogen through the $SiO_2$ and into the silicon substrate, plasma potential is preferably less than 10 V. Electron temperatures are preferably near or less than 2 eV. Ion density is preferably at least $10^{10}$ $cm^{-3}$.

Figure 4:
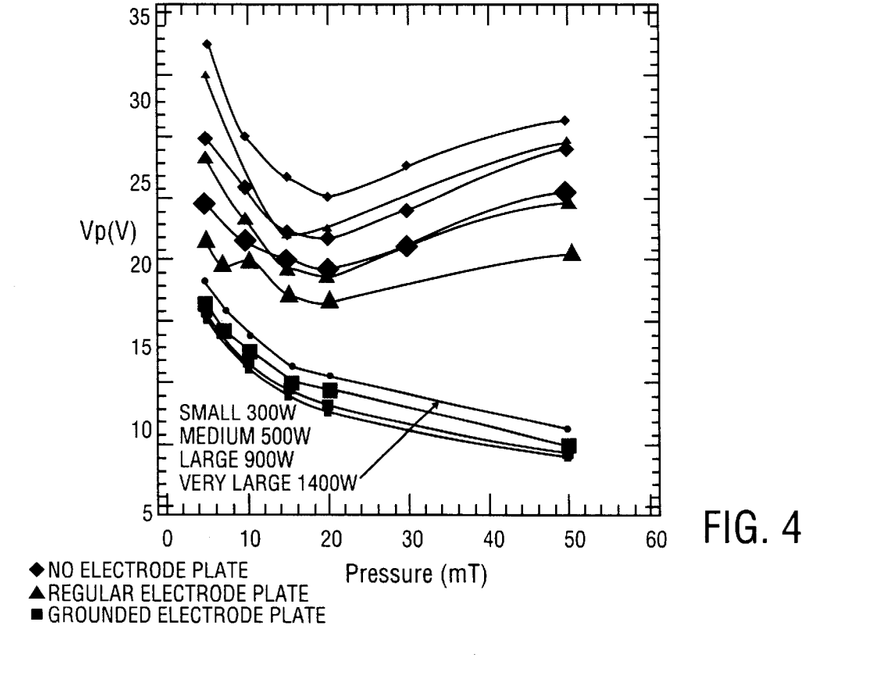
FIG. 4 is a graph illustrating plasma potential as a function of pressure for various RF source powers and electrode plate configuration as measured with a Langmuir probe.

FIG. 4 illustrates experimental results utilizing no electrode plate, a regular ungrounded electrode plate, and a grounded electrode plate, respectively. In each case, experimental results were obtained when applying 300 W, 500 W, and 900 W of power to the RF coil 16. Larger blocks or triangles indicate larger power magnitudes. At a given power provided to the RF coil 16, the plasma voltage (Vp) is the smallest for a grounded electrode plate, higher for an ungrounded electrode plate, and even higher when there is no electrode plate. In other examples, effective RF power supplied to the RF coil 16 may be between 160 and 3000 W. Potentials below 10 V are not achievable without the grounded electrode plate. What should also be noted is that the potentials do not substantially increase with an increase in power provided to the RF coil. Even very large power magnitudes above 1000 W (e.g., 1400 W), create plasma voltages below 20 V at pressures above 5 milliTorr (mT), and plasma voltages below 10 V at pressures above 40 mT. the RF coil. Even very large power magnitudes above 1000 W (e.g., 1400 W), crease plasma voltages below 20 V at pressures above 5 milliTorr (mT), and plasma voltages below 10 V at pressures above 40 mT.

Figure 5:
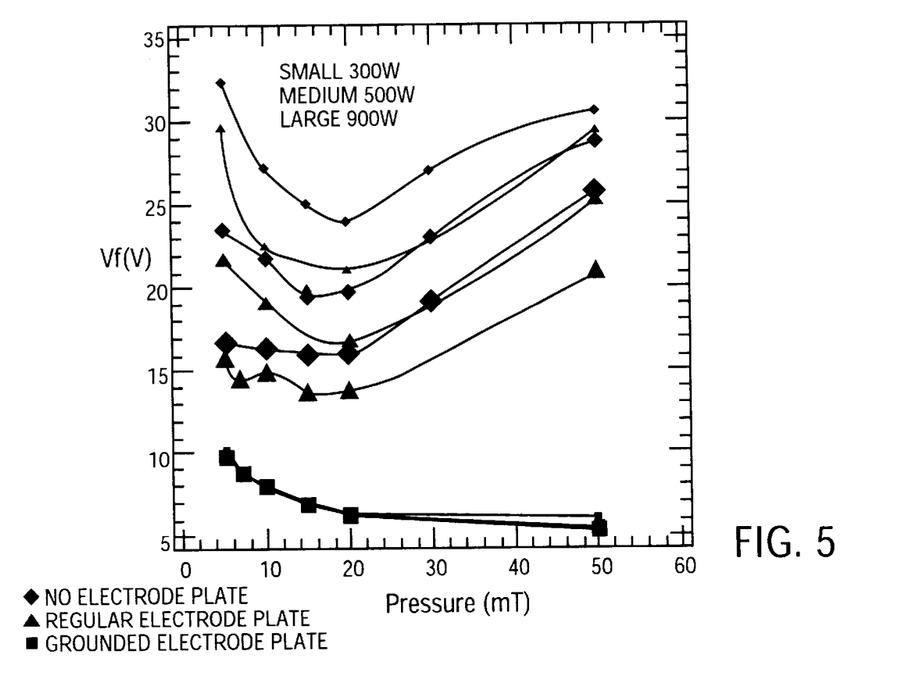
FIG. 5 is a graph illustrating the floating voltages as a function of pressure for the electrode plate configuration as measured with a Langmuir probe.

FIG. 5 illustrates the floating voltage of the plasma for the condition of FIG. 4. The potential at which the wafer resides is at or near Vf. Again, it can be seen that the substrate voltage (Vs) is the smallest for a grounded electrode plate, higher for an ungrounded electrode plate, and even higher when there is no electrode plate.

Figure 6:
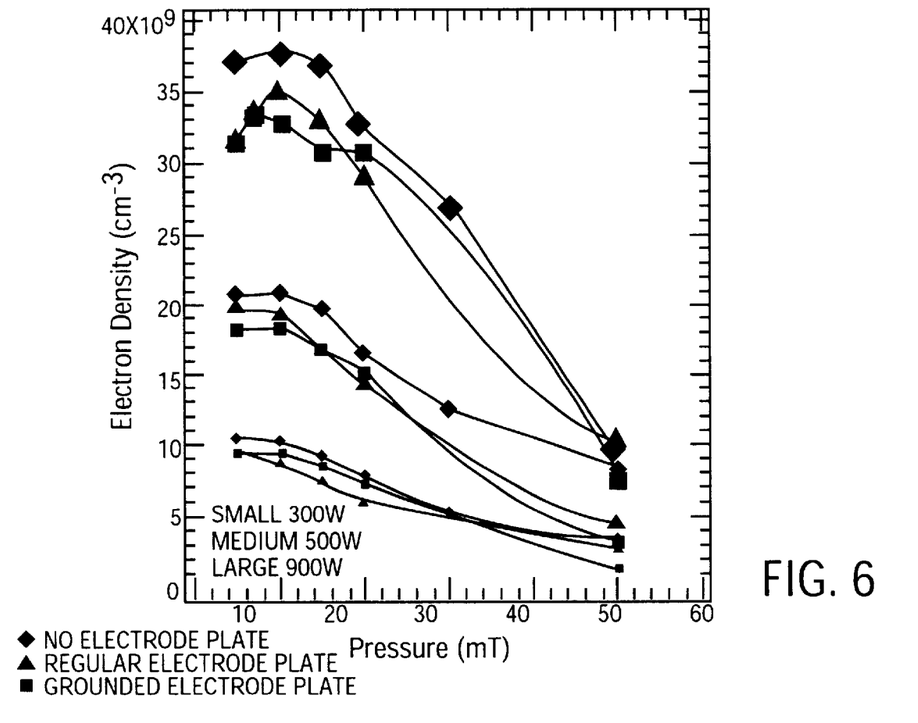
FIG. 6 is a graph illustrating electron density as a function of pressure for the electrode plate configuration as measured with a Langmuir probe.
Figure 7:
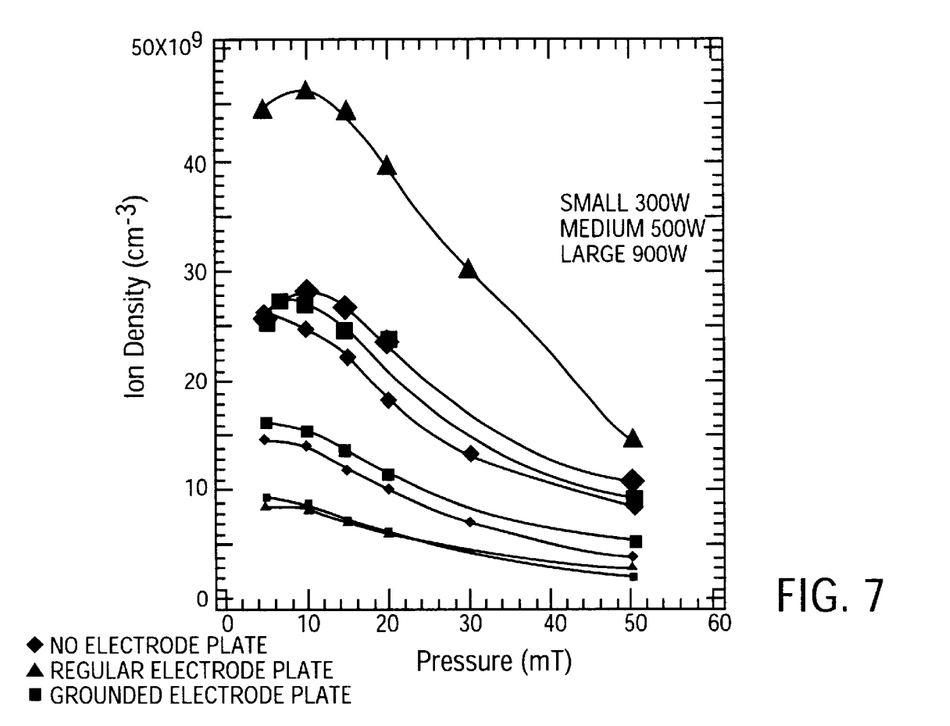
FIG. 7 is a graph illustrating ion density as a function of pressure for the electrode plate configuration as measured with a Langmuir probe.

FIGS. 6 and 7 illustrate electron density and ion density, respectively. For a given magnitude of power applied to the RF coil 16, there is very little difference between the electron density (or the ion density), when using a grounded electrode plate and when using an ungrounded electrode plate. Although not shown, ion densities above $50 \times 10^9$ cm$^{-3}$ are achievable when RF power above 1000 W is provided to the RF coil.

Figure 8:
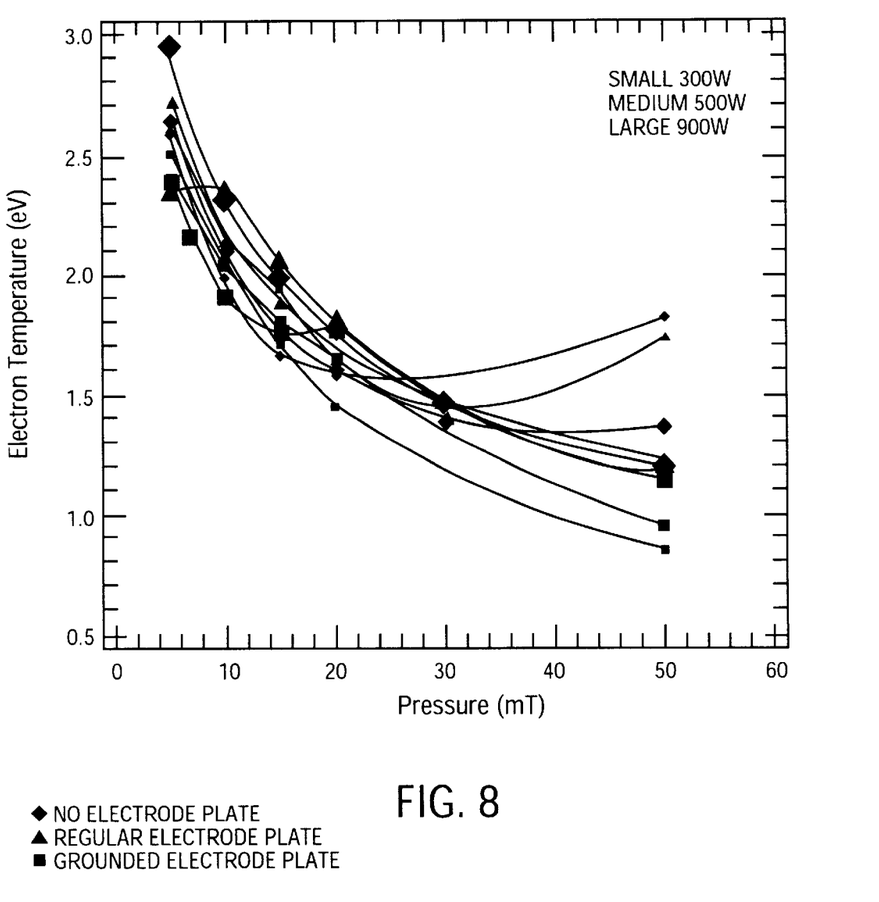
FIG. 8 is a graph illustrating electron temperature as a function of pressure for the electrode plate configuration as measured with a Langmuir probe.

FIG. 8 illustrates electron temperature. It can be seen that at lower pressures there is relatively little difference in electron temperatures when using a grounded, ungrounded, or no electrode plate. However, at higher pressures, typically above 40 mT, it can be seen that electron temperature is much higher where an ungrounded electrode plate is used, or when no electrode plate is used, than when a grounded electrode plate is used.

Figure 9:
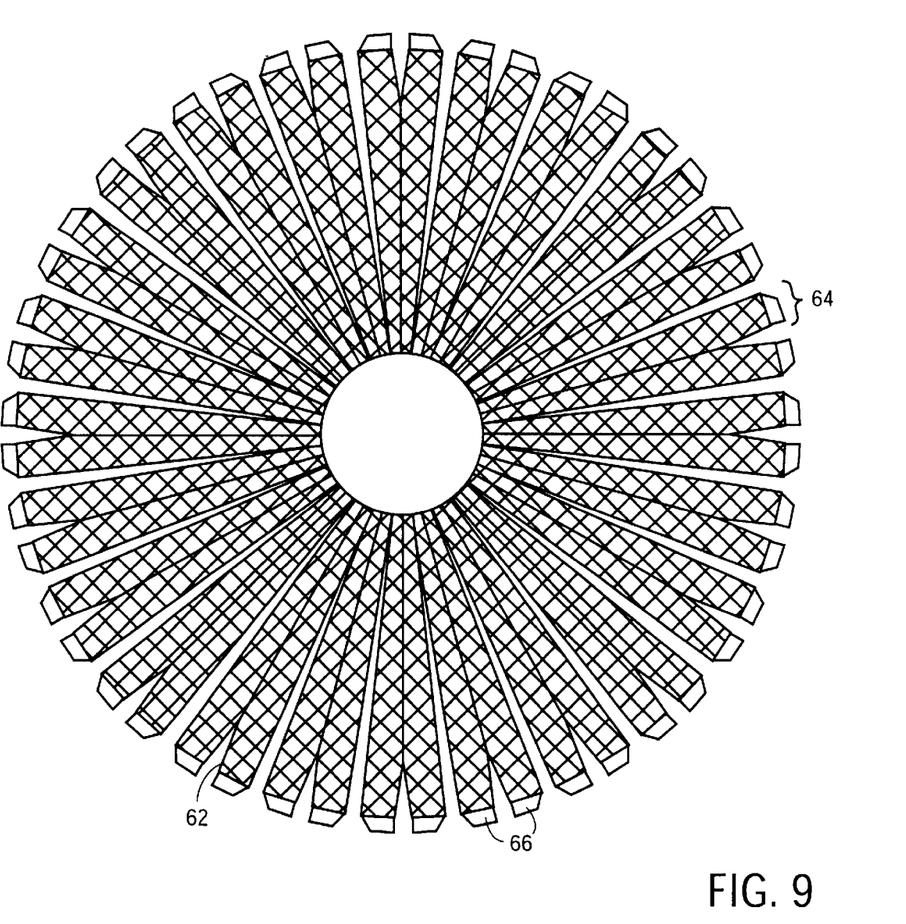
FIG. 9 is a bottom view of laminate, including an electrode plate, according to an embodiment of the invention.
Figure 10:
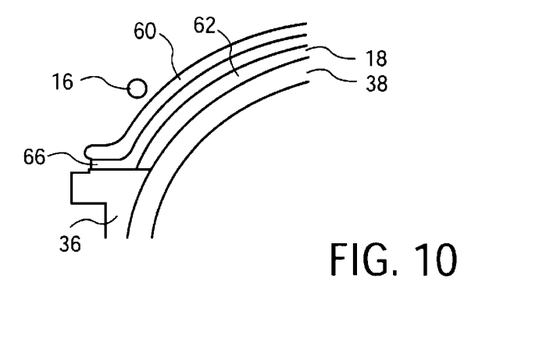
FIG. 10 is a cross-sectional side view illustrating the laminate in an installed position.

Referring to FIGS. 9 and 10, the electrode plate 18 is laminated between two dielectric sheets 60 and 62. The electrode plate 18 and the dielectric sheets 60 and 62 are formed in strips 64 that, when folded toward one another, collectively define a dome shape. The dielectric sheet 60 is positioned at the top between the electrode plate 18 and the RF coil 16. The dielectric sheet 62 is located between the electrode plate 18 and the upper wall 38. Ends of the electrode plate are not covered by the dielectric sheet 62, to leave exposed lands 66. The exposed lands 66 contact a conductive portion of the conductive body 36, to ground the electrode plate 18 to the conductive body 36. The lands 66 are disposed on a perimeter of the electrode plate 18, so that the electrode plate 18 is peripherally grounded. Peripheral grounding of the electrode plate 18 ensures that the entire electrode plate 18 is as close to zero volts as possible.

The plasma voltage can also be reduced by pulsing the RF power provided to the RF coil 16. In the examples that are now provided, the electrode plate 18 was not grounded, although it should be understood that the electrode plate 18 may be grounded in addition to pulsing of the RF power provided to the RF coil 16.

Figures 11, 12:
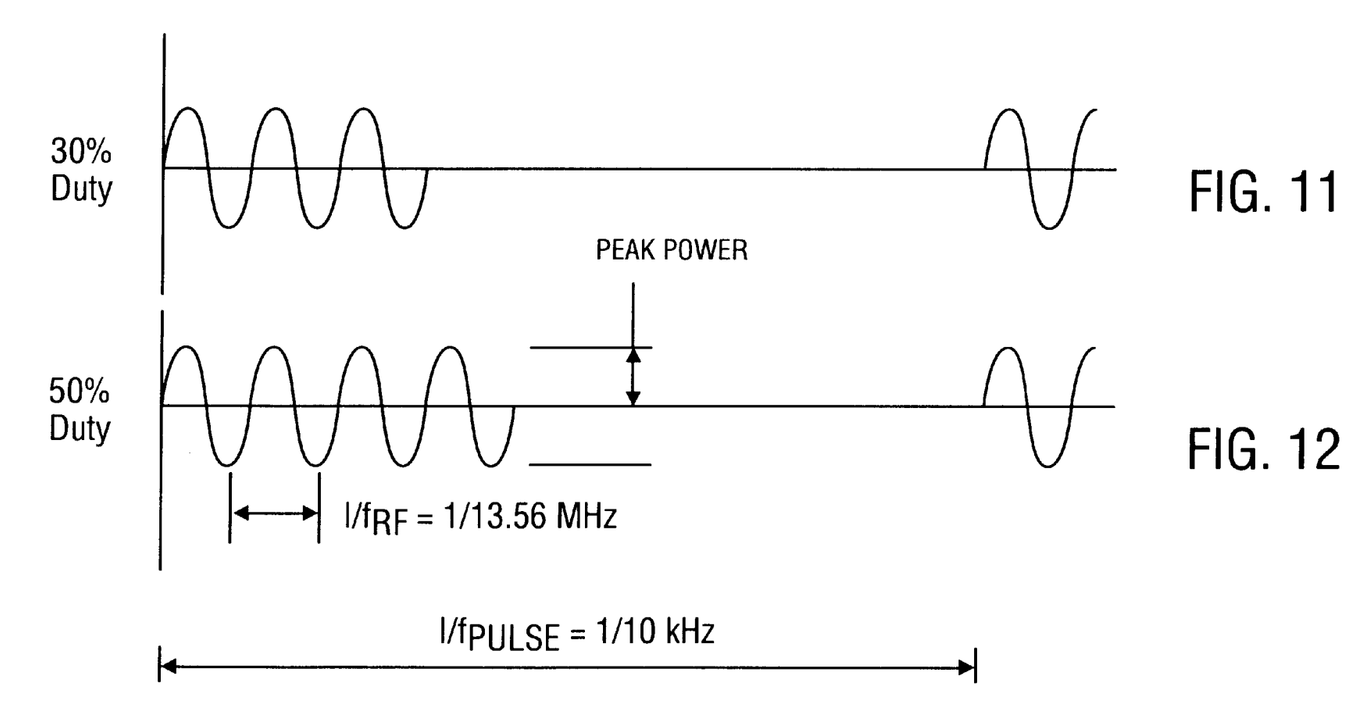
FIG. 11 is a graph illustrating pulsing of RF power to an RF coil with a 30% duty cycle.
FIG. 12 is a graph similar to FIG. 11 at a 50% duty cycle.

As illustrated in FIGS. 11 and 12, RF power having a frequency of 13.56 MHz and a predetermined peak power is provided to the RF coil 16. The RF power may be automatically switched on and off, i.e., "pulsed." In the examples that are provided, the RF power is automatically pulsed at a frequency of 10 kHz. In other examples, the RF power may be pulsed at frequencies between 1 kHz and 100 kHz. The composition of the nitrogen plasma is continuously varied by varying the RF current between high and low states. In FIG. 11, the duty cycle, i.e., the total amount of time that the RF power is on, is 30%, and in FIG. 12, the duty cycle is 50%. The RF source 50 is pulsing-enabled, and both the pulsing frequency and duty cycle are manually adjustable. The effective delivered power is the peak power times the duty cycle. In other examples, the duty cycle may be between 10% and 90%. In the given example, the amplitude of the RF power is continually altered between 0% and 100%, but in another example, the amplitude may, for example, be altered between 10% and 100%.

Figure 13:
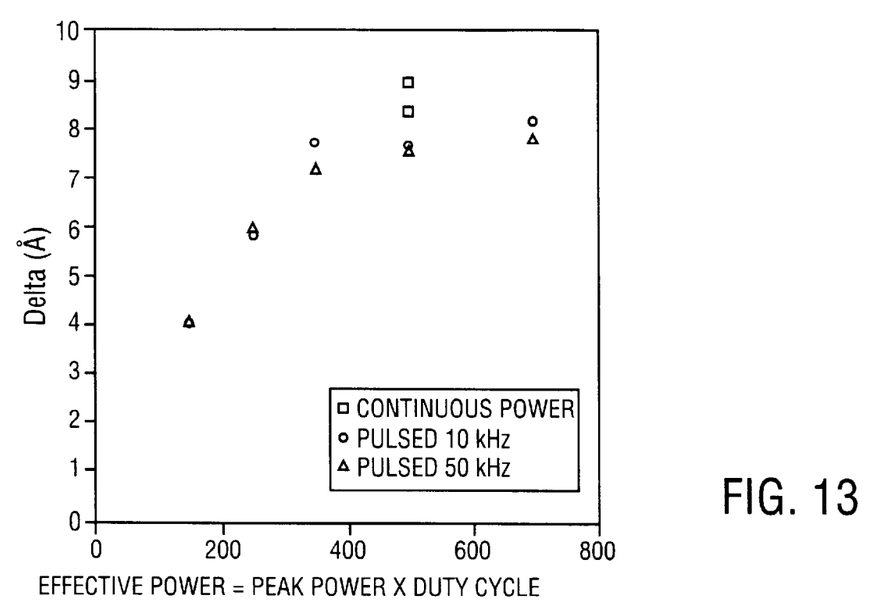
FIG. 13 is a graph illustrating thickness change before and after nitrogen plasma treatment with pulsed RF power, and provides a measure of incorporated nitrogen.

One way to measure incorporation of nitrogen is by measuring the thickness change ("optical delta") before and after a nitrogen plasma treatment. A larger thickness change indicates more nitrogen incorporation. As shown in FIG. 13, the amount of incorporated nitrogen using continuous power can also be achieved using pulsed power, with the amount of incorporated nitrogen scaling approximately with the effective delivered power. The change in optical thickness is relatively insensitive to pulsing frequency.

Figure 14:
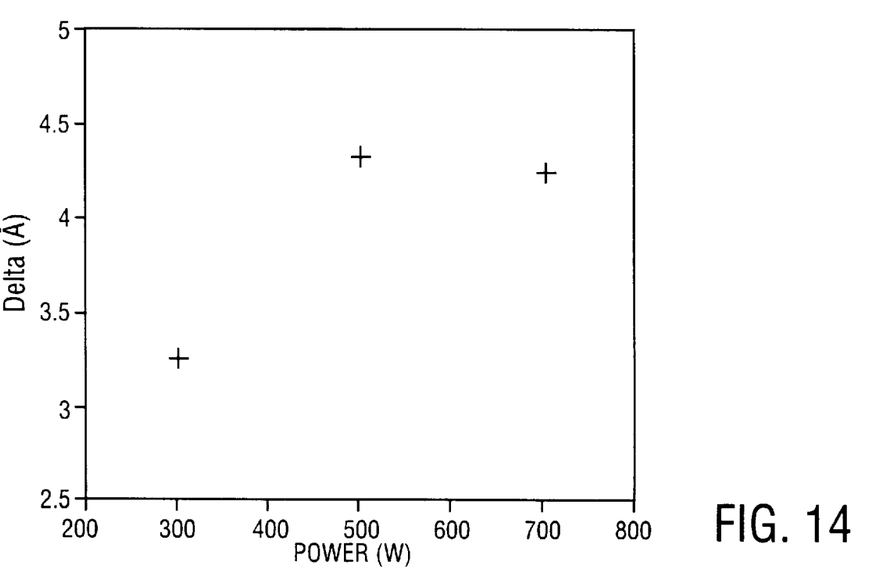
FIG. 14 is a graph illustrating thickness change for different samples processed at different continuous RF power settings.

FIG. 14 illustrates optical delta for samples prepared with continuous RF source power; the saturation in incorporated nitrogen with power is observed for both pulsed and continuous power.

Figure 15:
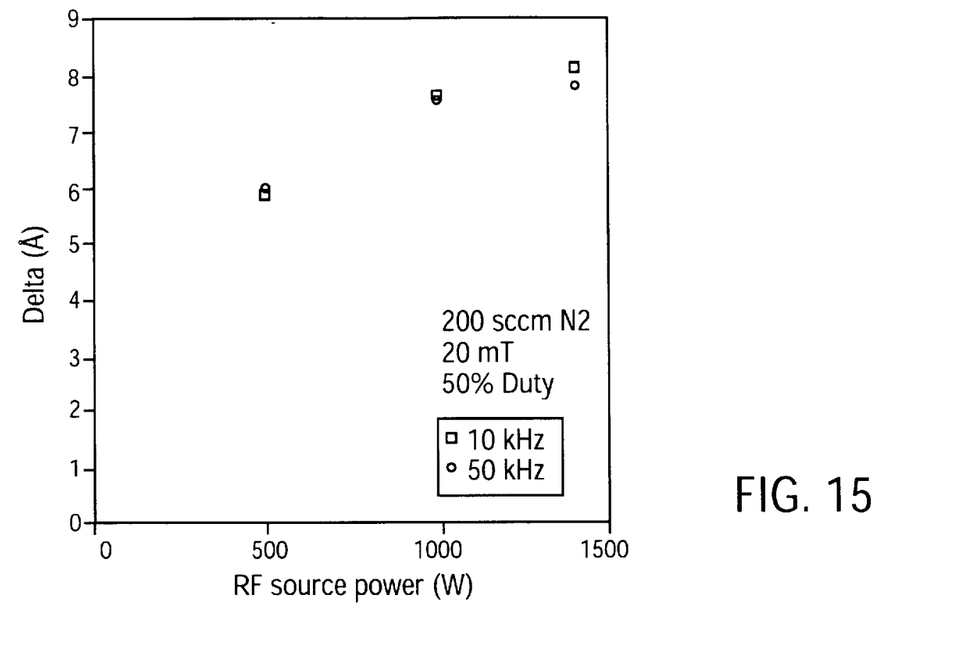
FIG. 15 is a graph illustrating thickness change as a function of RF source peak power for two pulsing frequencies.
Figure 16:
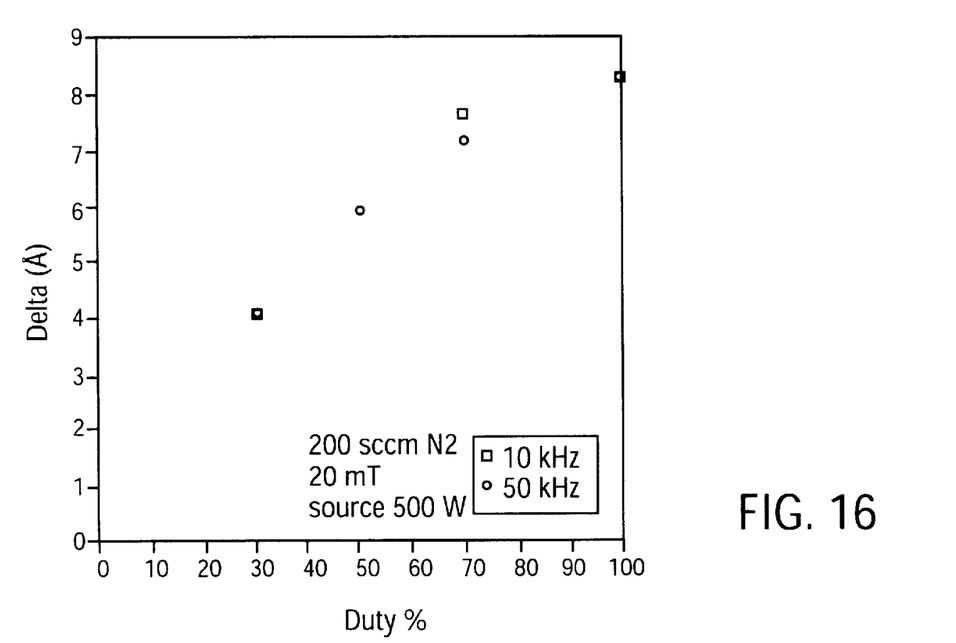
FIG. 16 is a graph illustrating thickness change as a function of duty cycles for two pulsing frequencies.

FIGS. 15 and 16 show the same data as in FIG. 13, plotted against source power and duty cycle, showing the same trends as FIG. 13.

Figure 17:
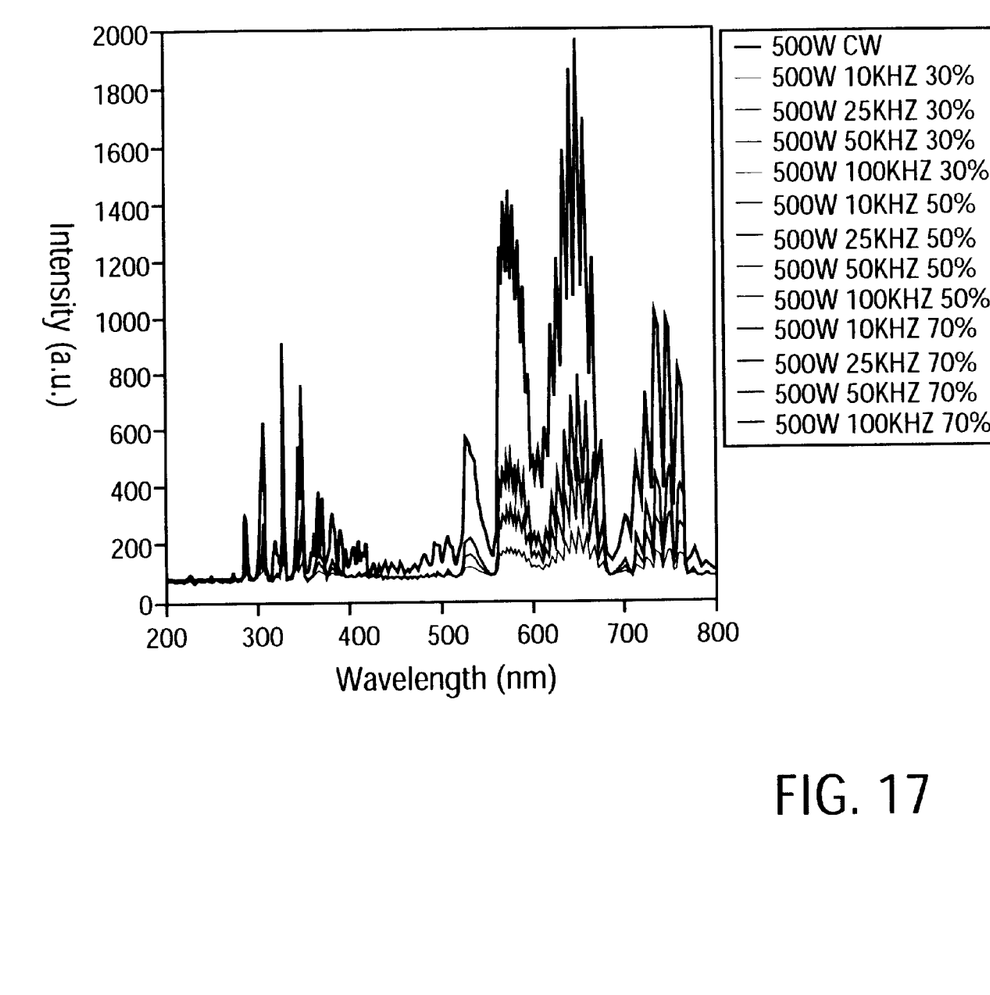
FIG. 17 is a graph illustrating optical emissions spectra for 500 W peak power at various pulsing frequencies and duty cycles.
Figure 18:
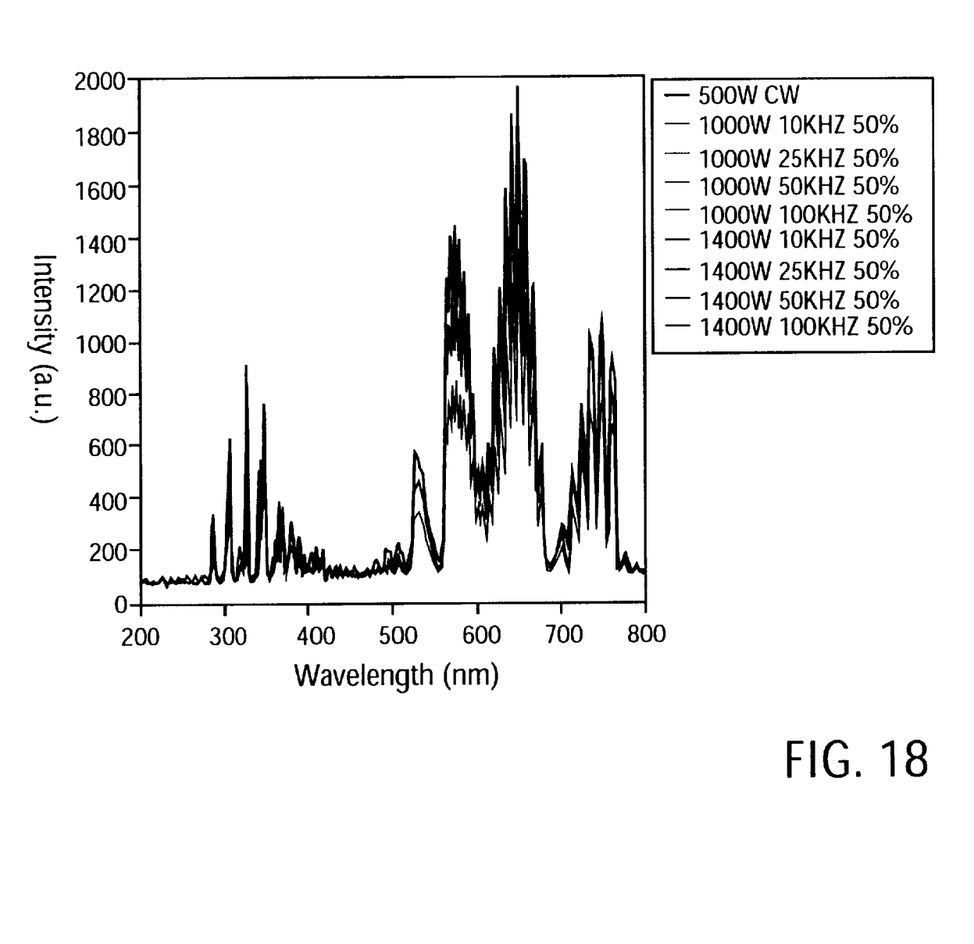
FIG. 18 illustrates optical emission spectra for a 50% duty cycle at various pulsing frequencies and peak powers.

In FIGS. 17 and 18, optical emission spectra are captured with an optical emission spectrometer. As one increases the duty cycle at fixed-peak RF power (500 W), the spectra approach the 500 W continuous power spectra (top line), as can be seen in FIG. 17. Pulsing frequency has a small effect on the observed intensity. FIG. 18 shows that the pulsed RF emission level can be restored to the continuous-power emission level (top line) by increasing peak RF power. Again, the emission is relatively insensitive to pulsing frequency.

FIGS. 13 to 16 indicate that on-wafer nitrogen incorporation similar to the incorporation of continuous RF power is possible with pulsed-RF plasmas. FIGS. 17 and 18 indicate that plasmas of similar ion density to continuous-RF power plasmas can be achieved with pulsed-RF power. These data, coupled with the effect of pulsed-RF power to reduce the electron temperature and plasma potential relative to continuous power, indicate that the pulsing of RF power provides a method for incorporation of nitrogen into gate dielectric oxides at lower energy levels. While incorporating the same amount of nitrogen in the oxide, nitrogen ions in the pulsed plasmas are accelerated into the wafer less than ions in the continuous-power plasmas because of the lower plasma potentials of the pulsed plasmas. Because of this reduced acceleration, the nitrogen will not penetrate as far into the oxide and the underlying silicon.

The simulation of ion implantation into silicon, specifically into Si(100), at various ion energies (10 eV to 30 eV), through a thin oxide layer shows less penetration for lower energy, as can be readily expected. Achieving nitrogen incorporation in such a low-energy fashion with the pulsed-nitrogen plasmas may provide for an improved dielectric that will lead directly to improvements in transistor performance.

It should be noted that although nitrogen incorporation into a thin gate silicon dioxide has been described, the described processes may have applications for nitrogen incorporation in other gate dielectric materials.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:
1. A method of processing a substrate, comprising:
   creating a nitrogen-containing plasma in the chamber, the plasma having an ion density of at least $10^{10}$ cm$^{-3}$ and a plasma potential of less than 20 V; and
   exposing a layer on the substrate to the plasma to incorporate nitrogen of the plasma into the layer on the substrate.

2. The method of claim 1, wherein the plasma has an electron temperature of less than 2 eV.

3. The method of claim 1, wherein the layer is silicon dioxide.

4. The method of claim 1, wherein RF current is provided to a coil located externally adjacent to a dielectric wall of the chamber, the coil creating an RF field in the chamber, the RF field creating the plasma.

5. The method of claim 4, wherein an electrode is positioned between the coil and the dielectric wall, the electrode being grounded.

6. The method of claim 5, wherein the electrode reduces the plasma potential to less than 10 V.

7. The method of claim 6, wherein the wall is dome-shaped, the coil spirals around an axis through the wall, and the electrode has an opening therein.

8. The method of claim 7, wherein the opening is within the perimeter described by the coil.

9. The method of claim 4, wherein the amplitude of the RF current is varied between high and low states.

10. The method of claim 9, wherein effective RF power applied to the coil is between 100 and 3000 W.

11. The method of claim 10, wherein a pressure in the chamber is at least 5 mT, RF power is at least 1000 W, and ion density is at least $5 \times 10^{10}$ cm$^{-3}$.

12. The method of claim 11, wherein the pressure is at least 40 mT and the plasma voltage is less than 10 V.

13. The method of claim 9 wherein the RF current is pulsed at a duty cycle of between 10 and 90%.

14. The method of claim 9, wherein the RF current is pulsed at a frequency between 1 kHz and 100 kHz.

15. A method of processing a substrate, comprising:
locating the substrate in a plasma-processing chamber;
flowing a nitrogen-containing gas into the chamber;
providing RF current to a coil to generate an RF field in the chamber, the RF field creating a nitrogen-containing RF plasma out of the gas, the amplitude of the RF current being varied between high and low states; and
incorporating nitrogen from the plasma into a layer formed on the substrate.

16. The method of claim 15, wherein the composition of the nitrogen-containing plasma is varied by pulsing of the RF current.

17. A method of processing a substrate, comprising:
locating the substrate in a plasma-processing chamber;
flowing a nitrogen-containing gas into the chamber;
providing RF current to a coil located externally adjacent to a dielectric wall of the chamber, an electrode plate being located between the coil and the dielectric wall and being at a voltage below 20 V, the RF field creating an RF plasma out of the gas; and
incorporating nitrogen ions of the plasma into a layer on the substrate.

18. The method of claim 17, wherein the electrode plate is grounded.

19. The method of claim 17, wherein a pressure in the chamber is at least 5 mT, RF power applied to the coil is at least 1000 W, a potential of the plasma is less than 20 V, and ion density is at least $5-10^{10}$ cm$^{-3}$.

20. The method of claim 19, wherein the pressure is at least 40 mT, and the potential of the plasma is less than 10 V.

* * * * *